United States Patent
Rodriguez (10) Patent No.: US 7,286,358 B2
(45) Date of Patent: Oct. 23, 2007

(54) SURFACE MOUNTED RESISTOR WITH IMPROVED THERMAL RESISTANCE CHARACTERISTICS

(75) Inventor: Edward T. Rodriguez, Winchester, MA (US)

(73) Assignee: Stackpole Electronic Inc., Raleigh, NC (US)

( * ) Notice: Subject to any disclaimer, the term of this patent is extended or adjusted under 35 U.S.C. 154(b) by 140 days.

(21) Appl. No.: 11/299,563

(22) Filed: Dec. 12, 2005

(65) Prior Publication Data

US 2006/0131068 A1    Jun. 22, 2006

Related U.S. Application Data

(60) Provisional application No. 60/636,785, filed on Dec. 16, 2004.

(51) Int. Cl.
*H05K 7/20* (2006.01)
(52) U.S. Cl. .................. 361/702; 361/704; 361/709; 257/685; 257/706; 257/712; 165/80.3; 174/16.3; 174/50.52
(58) Field of Classification Search ........ 361/702–714, 361/717, 719, 739, 770, 741, 749, 754, 803, 361/818; 257/685, 659, 772, 796, 707–727; 165/80.2, 80.3, 804, 185; 29/827, 832, 839, 29/840; 174/16.3, 252, 50.52, 521, 252.1
See application file for complete search history.

(56) References Cited

U.S. PATENT DOCUMENTS

| | | | |
|---|---|---|---|
| 3,835,434 A | * | 9/1974 | Kahn ..................... 338/22 R |
| 4,672,358 A | | 6/1987 | Pryst et al. |
| 5,159,530 A | * | 10/1992 | Komoto ................... 361/715 |
| 5,291,175 A | | 3/1994 | Ertmer et al. |
| 5,587,608 A | * | 12/1996 | Meng ....................... 257/712 |
| 5,710,494 A | | 1/1998 | Paweletz |
| 5,818,107 A | * | 10/1998 | Pierson et al. ............. 257/723 |
| 6,195,257 B1 | * | 2/2001 | Janicek et al. ............ 361/704 |
| 6,515,858 B2 | | 2/2003 | Rodriguez et al. |
| 6,620,515 B2 | | 9/2003 | Feng et al. |
| 6,764,759 B2 | | 7/2004 | Duvall et al. |
| 6,930,386 B1 | * | 8/2005 | Cesulka ..................... 257/719 |

OTHER PUBLICATIONS

International Rectifier Corporation, Application Note AN-949, "Current Rating of Power Semiconductors," 1999.
Rodriguez, Edward, Cooling a High Density DC-DC Converter Impacts Performance and Reliability, PCIM, Nov. 1999.
Yun, Chan-Su, Static and Dynamic Thermal Behavior of IGBT Power Modules, 2000, A dissertation submitted to the Swiss Federal Institute of Technology, Zurich.

* cited by examiner

*Primary Examiner*—Michael Datskovskiy
(74) *Attorney, Agent, or Firm*—Cesari & McKenna, LLP; Edwin H. Paul, Esq.

(57) ABSTRACT

A surface mountable resistor chip assembly, containing an integral heat sink, convective cooling provision exhibits higher continuous-mode power ratings than prior art surface mount resistors having comparable printed circuit board footprints. The preferred embodiments are also configured so as to reduce transient thermal impedance in a manner to exhibit increased power rating under short duration overload conditions. The assembly includes a housing with passages, holes or slotted openings, for the chip assembly and for air flow therethrough, and electrically conductive paths to bring the chip electrical connections out to pads on the housing arranged to make electrical connections to a printed circuit board.

16 Claims, 4 Drawing Sheets

SURFACE MOUNTED RESISTOR WITH IMPROVED THERMAL RESISTANCE CHARACTERISTICS

CROSS-REFERENCE TO RELATED APPLICATIONS

The present application claims the benefit of U.S. Provisional Patent Application Ser. No. 60/636,785, which was filed on Dec. 16, 2004 of common inventorship and title and which provisional application is hereby incorporated herein by reference.

BACKGROUND OF THE INVENTION

1. Field of the Invention

The present invention relates to surface mounted resistors and more particularly to high power dissipating surface mounted resistors.

2. Background Information

The use of power resistors in electronic circuits is well known. Such products are produced by dozens of vendors, with ratings of a few watts up to thousands of watts, involving hundreds of physical configurations. Over the past 15-20 years there has been significant growth in the use of surface mount components, with power resistors not immune to that trend. Driving this trend has been the desire for manufacturers and consumers to have functionality in ever-decreasing equipment size or, conversely, more functionality in the same size.

The pressure to lower cost has been an additional impetus since surface mount manufacturing techniques, being highly automated in nature, are particularly conducive to high throughput and high repeatability. Electronic assembly has steadily progressed to where more and more components, previously used only in their through-hole (components mounted with their leads extending through the printed circuit board) version, are becoming available as surface mountable versions.

This is another way of saying that surface-mount assembly, originally associated with low-power circuits, is increasingly being expected to accommodate higher-power functions. Viewed from a circuit designer's standpoint, surface mount only requires a major space consideration on one side of a printed circuit board while a through-hole part has an impact on available space on both sides of the PC board: on one side for the component itself and on the other for the protrusion of leads. That is to say. a surface-mount component, aside from its many other size and reliability advantages, minimizes the need for what is called "mixed technology: that is, the use of one manufacturing process for one side of the PC board and a different process for components affixed to the other side of the PC board.

The continued acceleration of such trends in compactness and automation has led to the introduction of surface-mount power resistors by many firms. In the simplest case, the device is a standard resistor chip, with perhaps a larger size, so that it can handle up to a watt. Above that power level, many firms have adapted a mainstay of more traditional through-hole power resistor technology; that is, a winding of resistive wire, to create wire-wound surface mount types.

U.S. Pat. No. 4,672,358 owned by Ohmite discloses a power resistor with its core of traditional design but with its leads arranged for surface mounting. Similar products are offered by many firms, e.g. Vishay, IRC, KOA, Panasonic. These power resistor s are offered with dissipation up to 5 watts.

Typically, even though wire wound power resistors are wound "non-inductively," there is some unwanted residual inductance. In high frequency applications, such inductance is a limitation. The present invention inherently minimizes the inductance.

In the U.S. Pat. No. 4,672,358 patent, the power resistor is placed down flush with the PC board surface. This is a limitation of the patent and limits the power resistor to about 50% of its stated rating. If the power resistor transmits too much heat to a circuit board, that circuit board will not pass safety-agency rating criteria. For example, a power resistor rated for a maximum temperature of 250 degrees C. (Celsius) might be operating safely at 200 degrees, but the PC board below it, being at perhaps 175 degrees C., is far above its safety-agency rating, which is typically about 100 degrees C. and 150 degrees C. for some types of fire resistant boards. U.S. Pat. No. 5,291,175 describes these considerations.

Another thermal consideration involves certain types of power resistors used in "dynamic-braking" applications. In such applications, the resistor can be subject to high current for a short period of time. U.S. Pat. No. 5,710,494 describes such applications and the principles involved. In a typical continuous-mode operation, the maximum temperature rating determines the power dissipated. If the temperature rises above that maximum, the resistor may fail. Such a rating can be influenced by the resistor surface area, the ambient temperature and cooling effects of air turbulence in the immediate vicinity of the resistor.

In a short-duration, high-current mode, however, the power dissipated in a resistor may be much higher that the listed rating and the maximum temperature not reached. This is because other parameters, namely, the mass and specific heat of the resistor control the temperature rise for short duration events. The mass acts like a shock absorber to short bursts of power. Therefore, in short-duration, high-current applications, such as dynamic braking, capacitive-discharge circuits, power supply inrush limiters etc., it is possible to have a small resistor do the job of a much larger one if the relationship of surface area, ambient temperature, air turbulence, pulse-current duration and material mass are understood wherein the temperature rise remains below the resistors rating.

In cases where it is possible to have the mass, as just referenced, in the form of a thermally conductive metal, such as aluminum or copper, it is possible to obtain substantially higher dissipation in a relatively small resistor assembly. Such higher dissipation is achieved by making use of the very low value of what is called transient thermal impedance, a term long associated with power semi-conductors. International Rectifier Corp. Application Note 949, entitled "Current Ratings of a Power Semiconductor," 1999; and a paper by Chan Su Yun, entitled, "Static and Dynamic thermal Behavior of IGBT Power Modules," dated Jun. 9, 2000 and available on the Internet at: www.iis.ee.ethz.ch/csyun/papers/thesis/node71.html are incorporated herein by reference. These references describe the principles involved.

A paper by the present inventor entitled, "Cooling a High Density DC-DC Converter Impacts Performance and Reliability," published in PCIM Magazine (now Power electronics magazine), November 1999, pages 60-66 describes in detail heat removal from a power semiconductor chip whereby that heat travels from the chip through a series of barriers on its way to an ultimate cooling medium. This reference is also incorporated herein by reference. The carefully configured heat removal system described in this paper is used in preferred embodiments of the present invention to maximize power handling in both continuous and high-power transient modes.

SUMMARY OF INVENTION

In light of the limitations of prior art and other advantages described herein associated with surface-mount power resistors, the present invention provides reduced inductance, minimum heat transfer to mounting circuit boards, increased power-to-surface mount footprint ratio, increased short-duration overload rating, improved reliability and reduced cost.

In preferred embodiments, the resistive element has, not a wire or metal foil strip typical of conventional power resistors, but rather of a silk-screened layer of resistive film (called thick film) on a thin (typically under 025') aluminum oxide (alumina) substrate, with solderable termination pads at either end of the resistor film. The use of such technology for individual, commercial surface mount chips has been common for over 25 years.

For the sake of clarity, in deposited film resistor technology there are two principle methods: thick film and thin film. They are both "thin" but one is much thinner than the other. In the resistor industry, thick film typically refers to a process in which a resistive film paste, generally no more than 0.001-0.003"(25-75 microns) in thickness, is silk screened onto a substrate, after which it is fired, in a controlled but not vacuum environment, into a rigid, glass-like coating. Basic thick-film resistor technology is very well known, having been used for over 40 years.

With thin-film technology, a very thin film (typically no more than a few microns) is deposited, under vacuum conditions, onto a substrate. Thin-film processes are generally associated with much finer tolerances and more specialized materials. Thin film technology, employing such techniques as metal-vapor vacuum deposition and sputtering, has been in use with increasingly sophisticated processes, for over 50 years.

The termination connections may or may not be brought over the edge of the resistor onto the back-side of the chip depending on manufacturing preferences. If it is brought around to the back-side, the chip is know as having "wrap-around" metallization. Well over 95% of such chips today employ such wrap-around metallization, a technique for best compatibility with solder mounting onto a PC board.

With one of the larger versions of a conventional thick film resistor chip, measuring 0.250" by 0.125" (called a 2512 chip), operating under load and generating some heat, that heat removal is mostly through a) the end terminations, which are soldered to the PC board, and to a lesser degree by b) the surface area of the chip exposed to the ambient air (a combination of radiation and convective cooling).

With the chip size as noted, it is difficult to operate at much more than a watt before the maximum rating of the resistive film, about 150 degrees C., is exceeded, or before the solder terminations approach their melting point. It should be emphasized that there would no fundamental power limitation of such a chip if the heat were appropriately removed with 100% efficiency. It is simply that there is not enough surface area exposed to the surrounding air or enough heat conduit area through the solder pads. Heat leaves the chip just like water in a drain-pipe. If the pipe is too small, the water cannot be quickly removed.

Therefore, for an easier understanding of the principles involved, the chip can be thought not to have a fundamental limitation, An objective of the present invention is to maximize the transfer of heat to the ultimate cooling medium, the surrounding air. The first step is to lessen the first heat removal barrier. It has been noted that with the standard wraparound resistor, the heat removal is to the PC board through the solder pads at either end and, then, from the surface of the PC board to the air. In a preferred embodiment of the invention, the standard wraparound approach is replaced by one which consists of metallizing the back-side of the chip opposite to the resistive film and then soldering that metallized surface to a thermally conductive metal such as copper or aluminum.

In this manner, there is an extremely effective heat removal path, only about 0.020" long, from the heat-generating resistive film to the metal surface. Furthermore, all portions of the resistive film are only 0.020" away from the metal surface, unlike with a wraparound configuration in its traditional method of usage, where most of the heat has to travel from the center out to the edge before it can exit. In other words, the best heat transfer comes from metal-to-metal, molecularly bonded contact.

The metal surface to which the chip is soldered is actually part of an extruded aluminum structure, which has an overall surface area much greater than the chip itself. Consequently, it acts as a surface area "amplifier." The heat from the chip is rapidly transferred to a metallic area, which can typically be over 50 times greater than the chip.

As a result, when air is passed over the aluminum structure, the air can remove far more heat than if only passing over only the small surface area of a 2512 chip. This is the basic theory of a cooling fin. In preferred embodiments, the present structure with the mounted chip has through slots or holes that provide added surface for dissipating heat to cooling air, especially air that is flowing through the slots or holes. Also, in a preferred embodiment of the present invention the structure is designed with added mass that enhances the resistor's short-duration power handling.

As earlier noted, the practical power-handling capability of the resistor chip is directly related to its capacity to effectively remove heat from the chip and prevent the resistive film or its contact terminations from reaching temperatures where undesirable electrical or metallurgical changes occur. That heat removal effectiveness is directly related to the surface area (the cooling fin) of the resistive film and inversely proportional to the thickness of the alumina substrate (internal heat takes time to reach the surface for cooling). The heat removal effectiveness is further influenced by the method of bonding the alumina to the metallic heat sink and the subsequent method of transferring heat from the heat sink to the surrounding air.

The heat removal from the metallic termination areas is important due to possible thermal fatigue of the terminations. This heat removal is influenced by the method of making connections to those terminations. For example, if the resistor is soldered to a PC board, there is, because of the larger cross-section of the thermal interface, a better metallic heat-removal path than if there were simply semiconductor-type wire bonds to the chip. With wire bonds, a connection can be made, which is excellent from an electrical standpoint, but under most conditions, the cross-section of the wire is insufficient to contribute meaningfully to heat removal.

The paper, "Cooling a High Density DC-DC Converter Impacts Performance and Reliability," noted earlier, describes in detail a) the process of heat transfer from a dissipative source such as the resistive thick film, through multiple materials and interfaces, and then ultimately to the surrounding air, and b) how that heat travel path can be modeled as a cone, with the apex of the cone being the source of dissipation. U.S. Pat. No. 6,515,858 describes methods for implementing the principles involved in the conical path of heat removal from a dissipative point source to surrounding air.

In as preferred embodiment, the resistor chip is soldered to the non-anodized but solderable surface areas of an extrusion. The heat travels from the soldered interfaces throughout the volume of the extrusion metal, after which the surfaces of the extrusions pass heat to the surrounding air, which may be static or moving. The extrusions also have integral details which serve both as a conductive path to a printed circuit board and as an extra heat-removal mechanism for the chip terminations to ensure that those terminations remain at a lower temperature than the resistive film. In an embodiment there is an interference fit between the chip and the extrusion structure that promotes heat removal.

In a preferred embodiment, the extrusion is made up of a pair of mirror-image parts which are electrically isolated from one another to ensure that, electrically, there is only the resistor value between one termination and the other. As part of this embodiment, the back-side metallization of the chip, as well as the final position of the extrusion pair, exhibit a narrow stripe where there is no electrical conductivity. This insulated area is controlled to guarantee a voltage or dielectric strength rating which might typically be in the hundreds of volts.

It has been noted that the extrusion parts are such that contact is made to the chip in a way which also serves to remove some heat. It is known among resistor chip manufacturers that in a typical surface-mount application, the center of the chip is usually much hotter than the ends near the terminations, with the elevated-temperature point being known as the "hot spot." When the back-side of the chip is appropriately bonded to a heat sink surface, that hot-spot effect can be lessened because all portions of the resistive film have essentially the same distance to travel to the heat sink. Theoretically, this would mean that the chip could be operated at higher power, likely up to more than the normal 150 degrees C. rating, since 175 degree C. operation would still be well below the original processing temperatures for the chip.

An important reason for not letting the terminations overheat is that the terminations could be weakened. That is, in the presence of repeated extreme temperature cycling, there could be thermal fatigue of the solder on those terminations. The presence of substantial metallic mass in the contacts to those chip solder pads terminations removes heat in those specific areas so that just like a PC board mounted chip, the ends are cooler than the center. Nevertheless, the presence of the hot spot is not an issue as long as it is taken into account in the rating of the resistor assembly. An important objective of the present invention is to prevent the termination temperatures from becoming the limiting factor in the power rating of the assembly. In other words, it is an objective of the present invention for the terminations and the resistive film to have comparable safety margins.

The extrusion pair also has integral details such that there are electrically connective terminations comparable to those referred to in the industry as J-lead terminations. The final power rating of the assembly is determined by the thermal resistance (the total as combined for all heat paths) from the resistive film to the surrounding air. The principles of thermal resistance analysis are very familiar to those skilled in the use of power semiconductors and similar dissipative components requiring heatsinks or air cooling and need not be discussed in detail here.

Suffice it to say that thermal resistance is measured in degrees C. per watt. That is, for every waft of power in the chip/extrusion assembly within a given static or moving air environment, the resistive film temperature will increase by a specified number of degrees in accordance with the design.

In preferred embodiments, the total thermal resistance is most influenced by a) the individual thermal resistance from the resistive film, through the alumina, to the extrusion metal, b) the surface area of the resistive film and c) the surface area of the extrusion metallic area exposed to the surrounding air. Having one be superior while another is poor would be of no benefit since they are additive. Therefore, it is an objective of the present invention to reflect the point of diminishing return in optimizing (minimizing) any given contributor to thermal resistance relative to the overall size, power and cost objectives.

While the three largest contributors to thermal resistance have just been noted, there are others as well, although individually they are less influential. Nevertheless, as a collective contributor they cannot be ignored. They include the cross-sectional thickness of the extrusion, the thickness of the alumina, characteristics of the chip-to-extrusion thermal interface, the extent to which the extrusion profile restricts air velocity through it, the air velocity and direction and, finally, metallic distance from the bottom side of the resistor chip to the distal points of the extrusion.

The extrusions are initially fabricated as thin wall aluminum components and are selectively tin plated so as to be compatible with a solder process. While aluminum is not normally solderable, there are well-established techniques in the plating industry for preparing the aluminum to accept a conventional solder process.

In the assembly process, an extrusion piece is pushed onto each side of the resistor chip making an interference contact that holds the chip in place. Before or after mounting the chip, solder paste, for the first proposed embodiment, can be applied to the extrusion areas where the chip is to be positioned and soldered. It is possible, with appropriate solder pre-plating of the extrusion, to eliminate this solder paste step. After mounting, the extrusion fingers are forced against the pair of resistor chip contacts while the back-side of the chip is pressed against the pair of extrusion surfaces. It will be clear to those skilled in such design of small assemblies that a variety of similar methods can be applied to position the extruded contact members close enough for soldering to the chip terminations.

When this chip/extrusion assembly is passed through an appropriate belt furnace or comparable elevated temperature environment, the solder paste (or pre-applied solder coating) or other appropriate solder locations melt and the chip metallized area becomes bonded to the combined flat surfaces of the extrusions. Similarly, the contact fingers become bonded to the chip terminations.

After assembly, an adhesively backed rectangular label or comparable flat, thin material is affixed to the top of the extrusion pair so that the surface becomes compatible with the vacuum pickup mechanism typical of surface mount pick and place equipment. Although the original chip had its own pair of contacts, that electrical connection method is now transferred down to the lower curved portion of the extrusion which is designed to serve as the J-lead surface mount contacts, a standard industry surface mount component technique.

The addition of the extruded pieces can decrease the overall thermal resistance from the chip to the convective air-flow ambient by typically a factor of 10 from what the chip would exhibit by itself. Furthermore, as earlier noted, the extruded pieces provide not just increased surface area for cooling but also a thermally conductive mass which can significantly decrease what is called transient thermal impedance, the determinant of short duration overload capability.

In other words, for short durations, such as a few seconds, it is mass rather than surface area which can most significantly determine power capability. For a fraction of a second or even a few seconds, a tiny heat sink can act like a heat sink 10 times its size. This means that an assembly containing a pair of paralleled 2512 resistor chips, which might only handle one watt in a standard surface mount configuration, might handle up to 10 watts or more with the proposed embodiment on a continuous basis and, for a second or two, as much as 30 to 50 watts before the extruded pieces heat sufficiently for the resistor film and the terminations to reach their temperature limit.

Because the complete product is assembled essentially in one pass through a reflow oven of established temperature profile, it is expected that the approach will provide improved repeatability and reliability lower cost and compatibility with visual inspection. With the final configuration, it is anticipated that a power density of more than 50 watts per square inch of PC board footprint is achievable, while still maintaining a height under 0.5 inch, a de facto standard height limit for many surface mount PC boards, even those involving substantial amounts of power.

In another preferred embodiment, the resistor chip, rather than having electrically separate back-side metallization, may be a standard wraparound type. In such a typical resistor, the top-side pads are normally only used to make connection to the resistor film. The metallization is continued from those connective points, over the side of the chip, and around onto the back-side, so as to transfer the pair of top side resistor contacts to the bottom side. Typically, the final connective metallized pads on the bottom side are slightly larger than the top-side pads to more readily facilitate subsequent surface mounting onto a PC board. However, they need not cover most of the bottom of the chip as in the first proposed embodiment since the back-side in this embodiment does not depend on a soldered interface for heat transfer.

In this embodiment, the solder which would have been the thermal interface between the chip and heat sink, as in other embodiments, is replaced by a thin layer of phase change material, a specialized paraffin material filled with thermally conductive microscopic particles. The material, normally existing as a solid, melts at a predetermined temperature and fills the microscopic voids which invariably exist between two mated surfaces.

Such voids, which might be no greater than 0.0001" (one ten-thousandths of an inch) in size, can significantly affect heat transfer if not substantially eliminated.

The material essentially memorizes the voids and when cooling, retains, on its surfaces, the shapes of those voids, regardless of how many subsequent power cycles occur.

Until the 1990's, metallurgical bonding, such as soldering, was widely accepted as the best method of reducing thermal resistance. Where soldering was not practical, thermal grease has been generally considered the next best method, although the use of such a material has a number of process related difficulties. While thermal grease is indeed an excellent interface material, it can exhibit poor results if not applied in the thinnest possible void-free manner.

For power semiconductor applications there has for some time been increased usage of fixed-thickness elastomer-based materials as a grease replacement option. While not as good as grease, they are more repeatable in their result and easier to implement, but again they can exhibit poor results if not applied with appropriate pressure. More recently, however, the phase change materials have in many instances shown superior heat transfer, less vulnerability to manufacturing control variations and, when used without a plastic tape to achieve electrical insulation, can begin to approach the thermal conductivity of a solder interface.

U.S. Pat. Nos. 6,620,515 and 6,764,759 describe the principles and general applications associated with the use of phase changes materials for heat removal in electronic components. Prior preferred embodiments illustrate three differences. First, the chip is of the standard wraparound type instead of having electrically isolated top and bottom surfaces. Secondly, the extrusion pair surfaces intended for most heat transfer, which had been selectively absent of anodizing and plated for solderability, are maintained as anodized surfaces. The anodic coating provides substantial electrical isolation so that even when the bottom side wraparound metal of the chip touches the heat sink surface, the chip is electrically isolated by the anodic film, which actually is a very hard aluminum oxide film with typical thickness of 0.001-0.003 in this application. Thirdly, the solder is replaced by the phase change material.

The phase change material is superior to conventional adhesive bonding of the chip in that it is less prone to separation during temperature cycling. It is superior to a filled-elastomer interface (having such trade names as Sil-pad) because, in conjunction with the anodic oxide coating, can be an electrically insulative heat-transfer medium less than a tenth as thick.

It is far superior to thin, coated thermoplastic insulators (having such trade names as Isostrate) because the anodic oxide coating is more than 10 times as thermally conductive as the thermo plastic materials for any given thickness. Also, this material is in a viscous state when warm, due to applied power, and there is always some compressive force created by intimate contact of the chip to the structure in the assembly, that results in a chip-extrusion thermal interface that approaches the molecular-bond performance of a soldered interface.

The option represented by the second embodiment provides the ability to take advantage of the off-the-shelf availability and wide variety of chip types associated with wraparound types. While not thermally equivalent to a soldered interface, the second embodiment nevertheless provides a very cost effective option when appropriately employed and in some cases some offers actual mitigation against thermal fatigue effects.

It will be apparent to those skilled in the use of adhesives in thermal management of microelectronic components that certain epoxy type adhesives, if filled with thermally conductive ceramic powder, having appropriate viscosities, can, if applied judiciously, approach the thermal conductivity of the phase changes materials. The choice of material is likely to be influenced by the power level and extent to which already existing process techniques favor one over the other.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

DESCRIPTION

Figure 1:
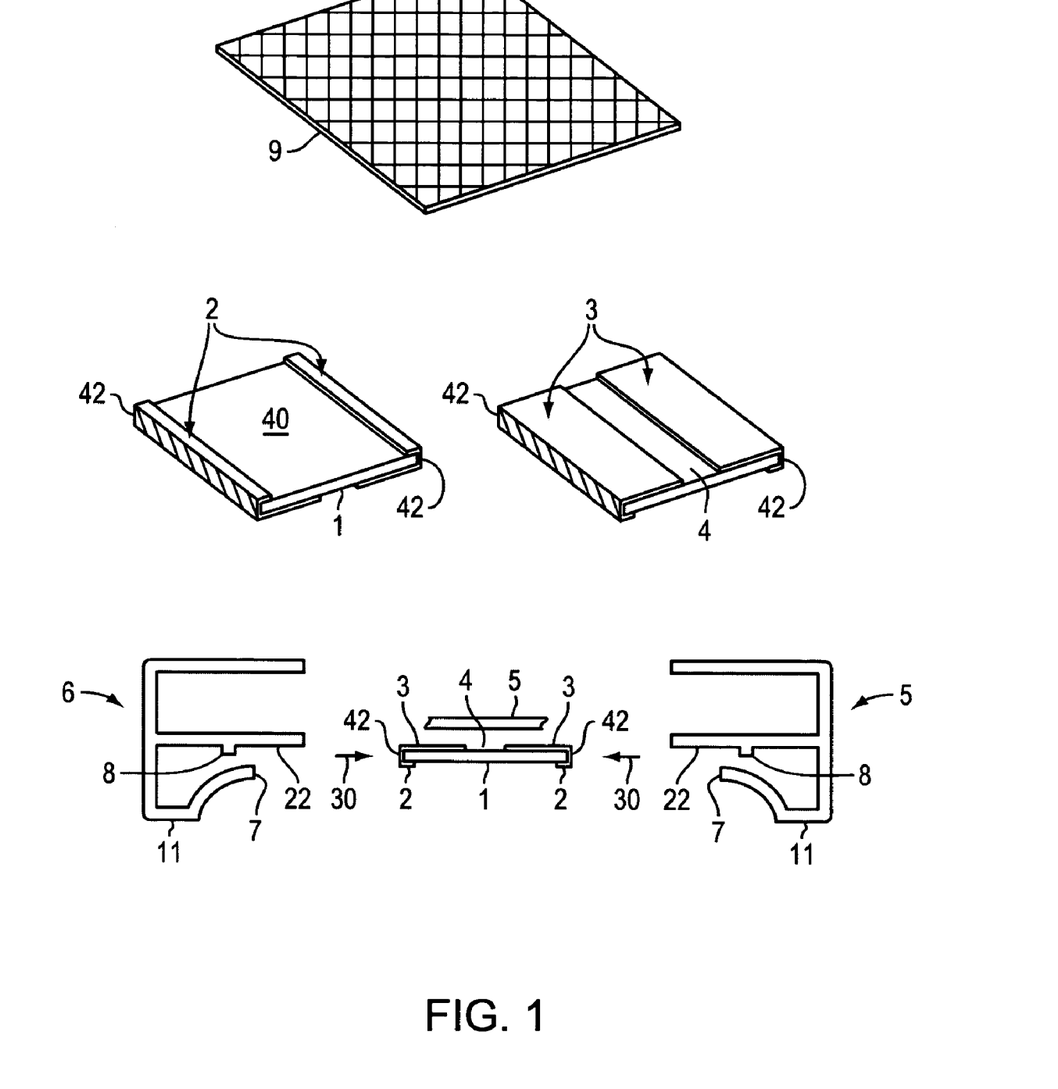
FIG. 1 is an exploded assembly drawing illustrating the piece parts for the complete assembly.

In FIG. 1 is shown a resistor chip 1, typically 0.025" thick, having a resistive film 40, topside solderable terminations 2. On the reverse side is a solderable metallization pattern 3 which covers the entire surface except for a narrow strip 4 which breaks the metallization into two distinct areas. The thickness of the narrow isolation between the metallizations 2 and 3 could typically be 0.030-0.050", or a distance sufficient to safely provide several hundred volts of dielectric isolation.

Each of the top-side metallizations 2 wrap around 42 the side and connects with the back-side 3 below it. In addition, the pair of bottom side metallized areas 3 need not be as large since they would play no role in heat transfer or solder attachment. Consequently, the space 4 between them, rather than being a narrow space as noted, can occupy most of the area on that surface, in a manner common to most commercial wraparound chip designs.

In other embodiments the space 4 may contain a resistive film that would be in parallel to the resistive film 40. In yet another embodiment there may be no wrap around where the metallization areas 2 and 3 would be electrically isolated.

Also shown are a pair of thin-wall aluminum extrusion sections 6 and 5, each of which is a mirror image of the other. This pair of extruded pieces is designed to hold one or more chips. The extruded pieces 5 and 6 are pushed 30 onto each side of a resistor chip 1 such that the flat sections 22 of the extrusions 5 and 6 are against the backside metallizations 3 of the chip and curved contact fingers 7 are pressed against the chip terminations 2. When the assembly is passed though a reflow oven the metallizations 2 and 3 on the chip becomes soldered to the extrusion surfaces and the surfaces 11, as described below will be soldered to a printed circuit board. In this way the electrical contacts of the resistor or resistors will make electrical contacts with runs on the printed circuit board.

The present invention is described in detail around a mounted film resistor, but, virtually any chip arranged for surface mounting could be used to advantage with the present invention. Certain dimensions of the extrusions 5 and 6 may be altered to accommodate any such chip.

In the second embodiment the soldering of the extrusion surfaces 11 to the printed circuit board is the same. However, the chip is not soldered to the extrusion surfaces. Instead, the two extrusion pieces to the chip, the extrusion surfaces meant for contact with the chip are coated with phase change material. During reflow soldering, the phase change material melts and the moderate compressive force of the extrusion surfaces to the chip retains the chip in place. The fact that the phase change material is in a liquid state at that time allows even more intimate contact than if their were a thermal grease interface. The liquid material fills in the microscopic inter-surface voids and that void-free condition remains after the unit cools.

Each extruded section has a ridge 8 to set alignment as to how far the extrusion can be pushed onto the chip, thereby ensuring that the two extrusions, after being pushed onto either side of the chip, are not in mechanical or electrical contact but yet are close enough to ensure the majority of the back-side of the chip is in contact with extrusion surfaces for heat transfer. Because miniature extrusions and resistor chips can be routinely manufactured with dimensional tolerances of only a few thousandths of an inch, the proposed embodiment can be assembled with a high degree of precision and repeatability.

Being of appropriately anodized aluminum, the extrusions 5 and 6 have surfaces which are not electrically conductive except for solderable areas. It is known to those skilled in the art that the thin aluminum oxide coating of an anodized aluminum surface has a diamond-like hardness and can exhibit well over 500 volts of dielectric isolation, and, with a special process called "hard anodizing" (thicker than conventional anodizing), provide several thousand volts of electrical isolation.

A label or similarly thin adhesive-backed material 9 is placed on top of the extrusion pair 5 and 6 after final assembly. It is meant to bridge the gap between the two extrusions and result in a complete surface without the discontinuity which would otherwise exist because of the air gap between the two extruded sections. The complete surface is desirable so that the vacuum pickup apparatus associated with surface mount assembly can maintain that vacuum during pickup of the component. With a discontinuity, the vacuum would not be maintained and alternate methods of component pickup would be required. Such alternate methods are available but would be a significant reduction in the options available to a manufacturing process.

The lower edge 11 of the extruded sections is plated for solderability so as to function as the surface-mountable contacts for the component. This configuration provides such contacts while still ensuring there is air transport space for cooling purposes under most of the components, particularly under the chip area.

Figure 2:
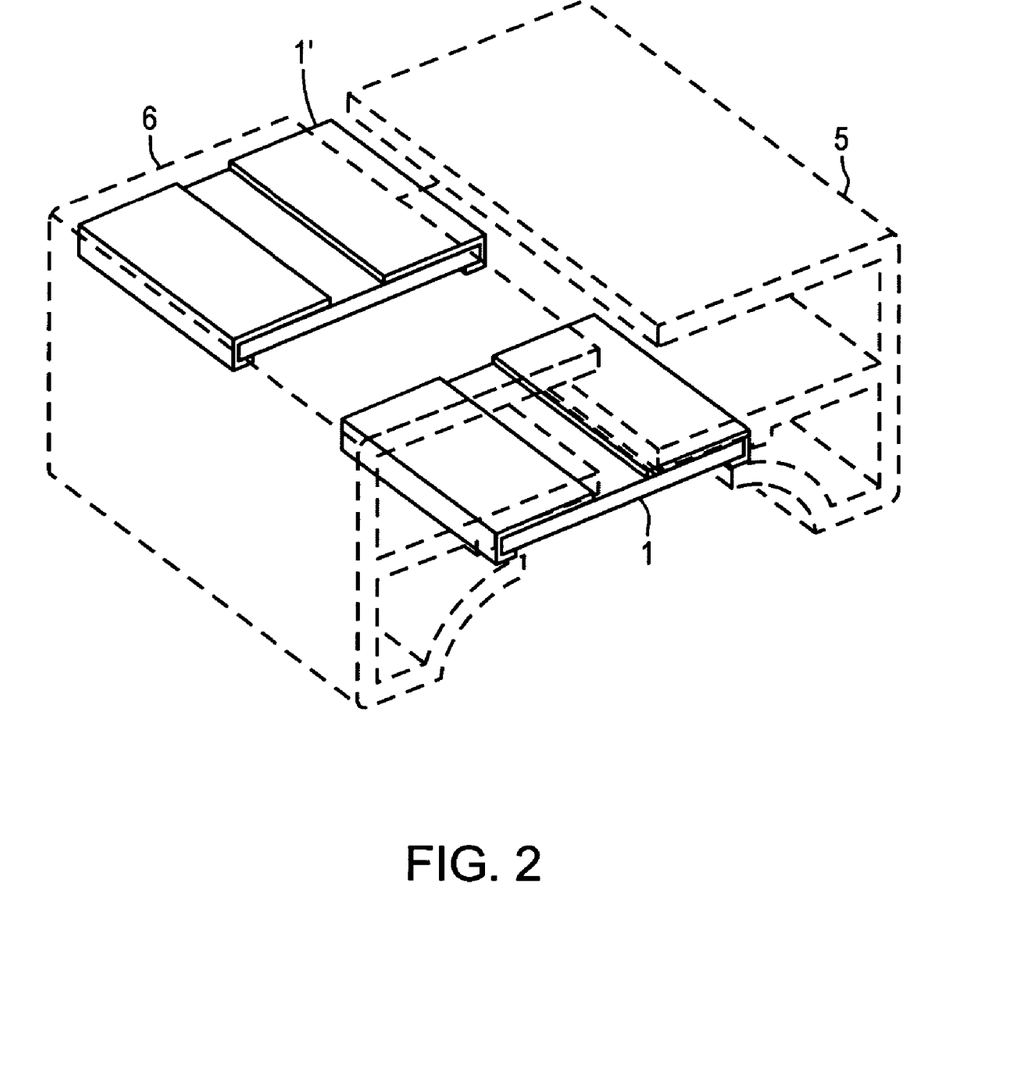
FIG. 2 is an isometric drawing illustrating a pair of resistor chips as installed on the assembly of FIG. 1.

FIG. 2 depicts a simplified curaway view of a) the final assembly with two chips 1 and 1' installed and without the material 9. The chips 1 and 1' are intsalled from one end of the extrusions, but the extrusions may be long enough to accept many chips.

Figure 3A:
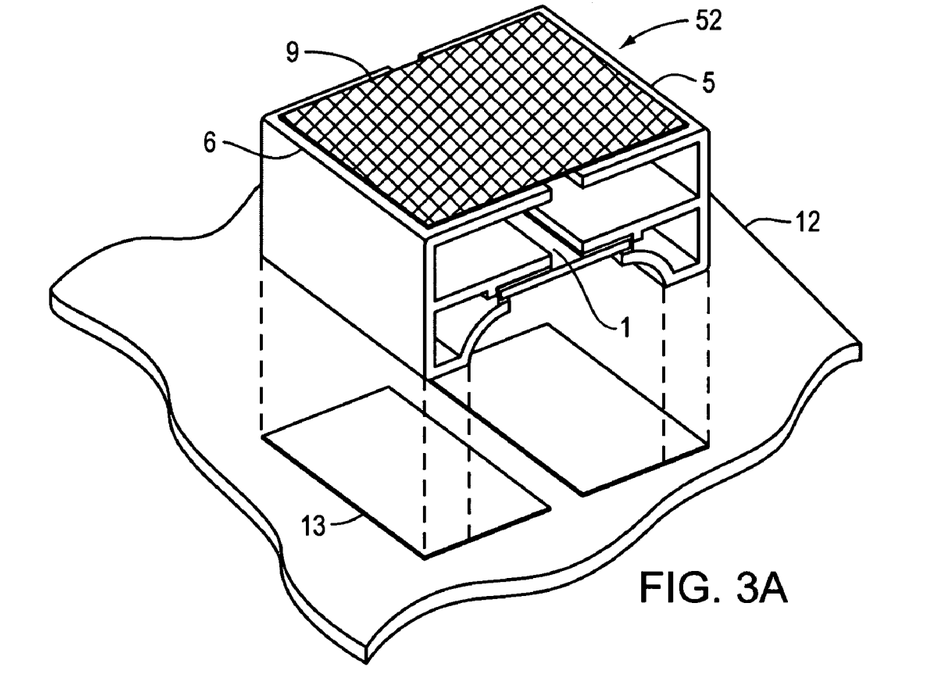
FIGS. 3A and 3B are perspective views showing the complete assembly as mounted on a circuit board.
Figure 3B:
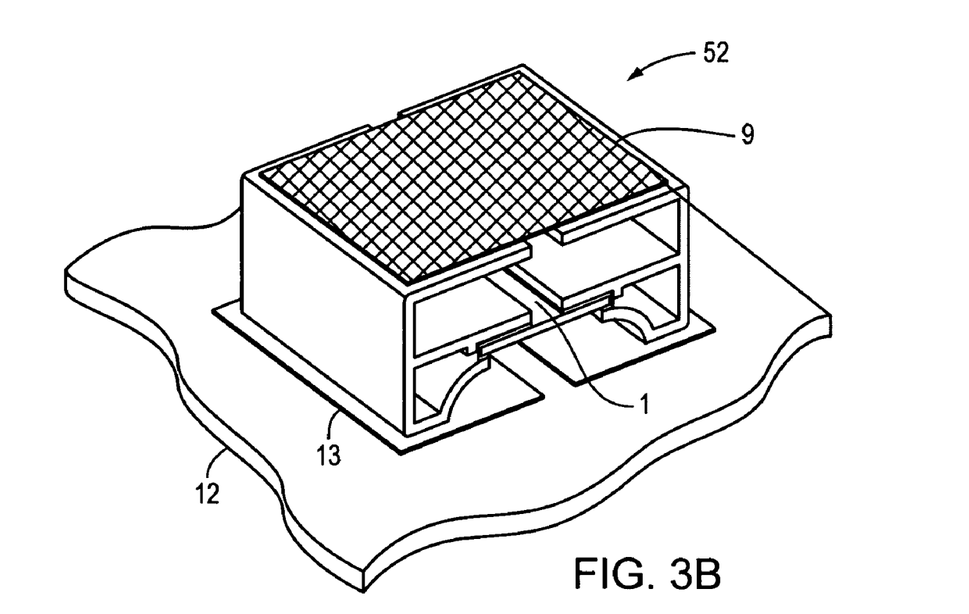

FIG. 3A shows a printed circuit board 12 with solderable pads 13 to receive the surface mountable component assembly 52 with the material 9 covering the extrusions. FIG. 3B shows the component 52 after surface mounting. A resistor chip 1 is shown mounted.

Figure 4:
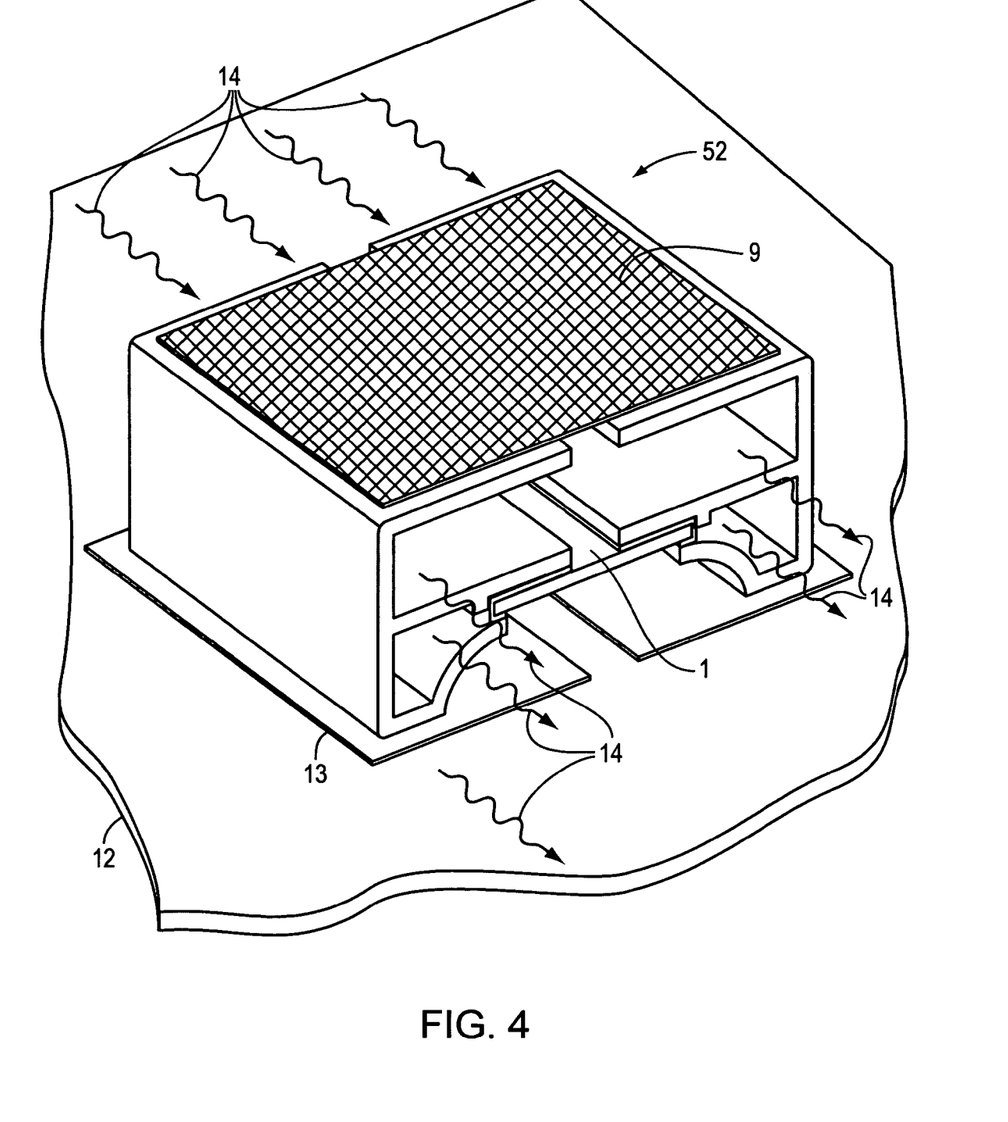
FIG. 4 is an assembly drawing of a complete assembly, mounted on a circuit board, and positioned for best use of convective air flow cooling.

FIG. 4 shows a surface-mounted assembly 52 in relation to airflow direction 14 to achieve best cooling performance. In this direction air passes over but also though the unit. If air were to be at a right angle to this direction, or perpendicular to the top surface, there would still be substantial cooling but there would be negligible air passing through the unit, with a potential 10% 20% reduction in cooling effect, accompanied by a corresponding reduction in maximum power capability.

With very small surface-mount components, there are very clear industry guidelines for component orientation for surface-mount reflow soldering so as to prevent process anomalies.

However, with the preferred embodiment shown, the potential spacing, outgassing, or solder bridging factors (common in most soldering processes) do not exist. Consequently, the PC board can be designed at the outset with the component in the best orientation relative to airflow, with far less concern about manufacturing process nuances.

It should be understood that above-described embodiments are being presented herein as examples and that many variations and alternatives thereof are possible. Accordingly, the present invention should be viewed broadly as being defined only as set forth in the hereinafter appended claims.

The invention claimed is:

1. A housing structure for mounting an electrical chip, wherein the chip has electrical connection areas, comprising:
   the housing structure consisting of one or more sections of thermally conductive material, which may be selectively painted, plated, anodized or otherwise coated, to define solderable areas,
   the housing contains an opening that accepts the chip allowing electrical contact between the electrically solderable areas of the housing and the electrical connection areas of the chip, and
   electrically conductive pads on the housing suitable for making electrical connections to corresponding pads on a printed circuit board, and electrical conductive paths in the housing making electrical connections between the electrical connection areas of a chip, if mounted, to the electrically conductive pads on the housing.

2. The housing of claim 1 wherein the opening that accepts the chip provides for an interference fit between the housing and the chip or a soldered connection which is reflowed for making electrical contact between the solderable areas of the housing and the electrical connection areas of the chip.

3. The housing of claim 1 wherein the housing is made of two mirror assemblies with opening to accept a chip, and a top covering that covers the top surface of the composite assembly, wherein the top of the composite assembly presents a surface with no openings thereby allowing a vacuum to pick up and place the composite assembly.

4. The housing of claim 1 wherein the housing is constructed with through passages to allow cooling air to pass, and wherein the surface of the housing exposed to the cooling air is at least 75% greater that the surface area of the chip.

5. The housing of claim 1 wherein the chip is a resistive film chip.

6. The housing of claim 1 wherein the housing comprises:
   a pair of extruded or formed copper or aluminum sections so shaped and configured with an opening wherein that each can be pushed or snapped or otherwise positioned onto or in close proximity to either side of one or more chips;
   the opening arranged with integral ridges or other details which accurately define the location of one or more chips when mounted;
   means for thermally but not electrically linking the sections; and
   means for mechanically fixing the sections with respect to each other.

7. The housing of claim 1, further comprising and access port for a thermo-couple or infrared thermometer or other thermal measuring device to accurate verification and/or characterization the thermal resistance from the chip to the housing sections and/or to the surrounding air.

8. The housing of claim 1 further comprising opening through passages in which airflow can pass over, through and under the chip.

9. The housing of claim 1 in which the principal heat removal is through the ambient air rather than a printed circuit board to which it is affixed.

10. The housing of claim 1 in which the temperature rise at the connections to the printed circuit board can be kept to no more than 60% of the temperature of hottest point of the resistive film.

11. A structure for surface mounting an electrical circuit or component fabricated on a chip, the electrical circuit or component having at least two electrical connections on the chip, wherein the chip dissipates heat, the structure comprising:
   a housing made of thermally conductive material;
   the housing having a first slotted opening arranged to accept the chip;
   the slotted opening having two internal electrically conductive pads that are electrically isolated from each other, the electrically conductive pads arranged to make electrical contacts with each of the two electrical connections on the chip;
   the housing having at least a second slotted opening that traverse through the structure parallel to the first slotted opening wherein cooling air may pass through each of the slotted openings;
   the housing arranged with two external electrical conductive pads, each arranged to mate with corresponding pads on a printed circuit board; and
   electrically conductive paths between one of the internal and one of the external conductive pads, wherein electrical coupling between the printed circuit board and the chip are made.

12. The housing of claim 11 further comprising intimate contact between the first slotted opening and the chip wherein heat generated on the chip flows from the chip to the housing, and from the housing to air passing through the slotted openings and from the chip to the printed circuit board through the electrical connections.

13. The housing of claim 11 wherein the housing comprises two mirror sections each section contain a ridge that positions the chip within the housing, and a material thermally joining the two sections without making electrical connections between the two internal or the two external electrical pads.

14. The structure of claim 11 wherein the electrical contacts between the chip and the housing comprise a thin layer of solder or a filled paraffin phase change material.

15. The housing of claim 11 wherein the first slotted opening has a surface that makes intimate thermal but not electrical contact with the chip.

16. A housing for mounting one or more electrical chips, wherein each chip has electrical connection areas, the housing comprising:
   two mirror assemblies of thermally conductive material with opening to accept a chip, and a top covering that covers the top surface of the composite assembly, wherein the top of the composite assembly presents a surface with no openings thereby allowing a vacuum to pick up and place the composite assembly, wherein of one or more sections of the thermally conductive material may be selectively painted, plated, anodized or otherwise coated, to define solderable areas;
   electrically conductive pads on the housing suitable for making electrical connections to corresponding pads on a printed circuit board, and electrical conductive paths in the housing making electrical connections between the electrical connection areas of a chip, if mounted, to the electrically conductive pads on the housing;

wherein the housing is constructed with through passages to allow cooling air to pass, and wherein the surface of the housing exposed to the cooling air is at least 75% greater that the surface area of the chip, and further wherein the mirror extrusions are formed of copper or aluminum sections so shaped and configured with an opening wherein that each can be pushed or snapped or otherwise positioned onto or in close proximity to either side of one or more chips, and wherein an opening is provided that accepts the chip suitable for making electrical contact between the electrically solderable areas of the housing and the electrical connection areas of the chip;

the opening arranged with integral ridges or other details on the extrusions that accurately define the location of one or more chips when mounted, means for thermally but not electrically linking the sections, and means for mechanically fixing the sections with respect to each other.

* * * * *